United States Patent
Fukagawa

(10) Patent No.: US 7,084,957 B2
(45) Date of Patent: Aug. 1, 2006

(54) SCANNING EXPOSURE TECHNIQUE

(75) Inventor: Youzou Fukagawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

(21) Appl. No.: 10/912,097

(22) Filed: Aug. 6, 2004

(65) Prior Publication Data
US 2005/0036124 A1 Feb. 17, 2005

(30) Foreign Application Priority Data
Aug. 13, 2003 (JP) ............................. 2003-292921

(51) Int. Cl.
 G03B 27/42 (2006.01)
 G03B 27/52 (2006.01)
(52) U.S. Cl. .......................................... 355/53; 355/55
(58) Field of Classification Search .................. 355/52, 355/53, 55, 67, 71; 356/399–401; 250/548; 430/311
See application file for complete search history.

(56) References Cited

U.S. PATENT DOCUMENTS

| | | | | |
|---|---|---|---|---|
| 5,416,562 | A * | 5/1995 | Ota et al. | 355/53 |
| 5,448,333 | A * | 9/1995 | Iwamoto et al. | 355/53 |
| 5,473,435 | A | 12/1995 | Masuyuki et al. | 356/372 |
| 6,097,495 | A * | 8/2000 | Uzawa et al. | 356/401 |
| 6,325,516 | B1 * | 12/2001 | Watanabe et al. | 359/601 |
| 2003/0172365 | A1 | 9/2003 | Fukagawa | 716/19 |
| 2004/0119956 | A1 | 6/2004 | Fukagawa | 355/52 |

FOREIGN PATENT DOCUMENTS

| | | |
|---|---|---|
| JP | 06-029172 | 2/1994 |
| JP | 09-079829 | 3/1997 |
| JP | 2000-299278 | 10/2000 |
| JP | 2003-292921 | 10/2000 |
| JP | 2002-134397 | 5/2002 |
| JP | 2004-363313 | 12/2004 |

OTHER PUBLICATIONS

Japanese Office Action dated Sep. 2, 2005, issued in corresponding Japanese patent application No. 2003-292921.

* cited by examiner

Primary Examiner—Henry Hung Nguyen
(74) Attorney, Agent, or Firm—Fitzpatrick, Cella, Harper & Scinto

(57) ABSTRACT

An exposure apparatus for exposing a substrate to light via a pattern of an original while the original and the substrate are scanned. The apparatus includes a stage configured to hold the substrate and to move, a projection optical system configured to project the pattern of the original onto the substrate, a measurement unit configured to measure a positional deviation between superposition marks formed on the substrate, and a controller configured to control operation of projection of a slit shot pattern of an original onto plural areas of a substrate, with each area partially overlapping four of the plural areas adjacent to each other. The projection is performed by keeping the original stand still and moving the stage, to cause the measurement unit to perform measurement of a positional deviation between superposition marks in each of the overlapping areas formed through the projection, and to control movement of the stage based on the measurement.

14 Claims, 10 Drawing Sheets

US 7,084,957 B2

SCANNING EXPOSURE TECHNIQUE

CLAIM OF PRIORITY

This application claims priority from Japanese Patent Application No. 2003-292921 filed on Aug. 13, 2003, the entire contents of which are hereby incorporated herein by reference.

Field of the Invention

The present invention relates to a scanning exposure technique used in the manufacturing of a microdevice, such as a semiconductor device.

BACKGROUND OF THE INVENTION

In manufacturing a semiconductor device, such as an IC or LSI, a multilayer circuit pattern is superpose-transferred onto a wafer. In some cases, different exposure apparatuses are used due to a difference in accuracy required in respective layers, and superposition accuracy (matching accuracy) must be maintained among different exposure apparatuses. Especially, in an exposure apparatus based on a global alignment method of measuring plural superposition marks transferred on a wafer so as to correct a positional shift to a wafer xy plane (a plane vertical to an optical axis of a projection optical system (defined with mutually orthogonal x and y axes)) and a rotational shift about a θ axis (rotation about an axis parallel to the optical axis of the projection optical system (z axis orthogonal to the xy plane)), the following adjustment operations are performed.

First adjustment item: adjustment of xy coordinate parallelism between the reticle projection image and wafer stage.

Second adjustment item: adjustment of xy axis rectangularity of the wafer stage.

Third adjustment item: adjustment of linearity of xy axes of the wafer stage.

Fourth adjustment item: adjustment of θ axis stability of the wafer stage.

Particularly, in a one-shot full exposure apparatus, regarding the third and fourth adjustment items, the linearity of the xy axes and the stability of the θ axis of the wafer stage are measured and corrected by the method proposed by the present applicant, i.e., measuring superposition marks formed by performing exposure and transfer such that adjacent shots partially overlap each other, and performing arithmetic processing at once on these measured data (for example, see Japanese Published Unexamined Patent Application No. 2000-299278).

For example, exposure is repeated such that adjacent shots in x and y directions partially overlap each other, as shown in FIG. 1, that is, a shot 31, a shot 32 adjacent to the shot 31 in the x direction, and a shot 33 adjacent to the shots 31 and 32 in the y direction, partially overlap each other, as shown in FIG. 2. Two superposition marks 34, 35 are formed in the x-direction overlap area, and two superposition marks 36, 37, in the y-direction overlap area. Then, relative distances dx, dy, and a relative rotational angle dθ in the respective shots are obtained from the data obtained from measurement of the relative positions of the overlapping marks by the least square method.

However, in the method disclosed in th above Japanese Published Unexamined Patent Application No. 2000-299278, in the case of a scanning projection exposure apparatus (so-called a scanner) to perform transfer by one-shot exposure using a slit shot, even if two or more superposition marks are formed in an area where shorter sides are adjacent, the influence of a relative rotational angle obtained from the difference among these marks is small and the linearity of the xy axes and the stability of the θ axis of the wafer stage cannot be measured with high accuracy.

SUMMARY OF THE INVENTION

The present invention has been made in consideration of the above situation, and has as its object to provide a scanning exposure technique useful for improvement in overlay accuracy.

To solve the above problem and to attain the object, the present invention provides the following aspects.

[Aspect 1]

An exposure apparatus, which projects a pattern on an original onto a substrate via a projection optical system while scanning the original and the substrate, comprises a stage which holds and moves the substrate, a projection system which projects a slit shot pattern formed on the original onto plural areas of the substrate and an area partially overlapping four of the plural areas adjacent to each other, by having the original stand still and moving the stage, a measurement system which measures a positional deviation between partial patterns included in the shot patterns in the overlapping area, and a control system which controls movement of the stage based on a result of measurement by the measurement system.

[Aspect 2]

In Aspect 1, the projection system projects the shot pattern so as to arrange respective centers of gravity of the plural areas at grid points.

[Aspect 3]

In Aspect 2, the grid points where the centers of gravity are arranged are different by line.

[Aspect 4]

In any of Aspects 1 to 3, a plurality of the partial patterns are formed on each of two straight lines parallel with a lengthwise direction of the shot pattern.

[Aspect 5]

In any of Aspects 1 to 4, the control system calculates at least one of a positional error and a rotational error in each of the plural areas and the overlapping area as a moving characteristic of the stage.

[Aspect 6]

In any of Aspects 1 to 5, the control system controls movement of the stage based on the calculated moving characteristic.

[Aspect 7]

In any of Aspects 1 to 5, the control system corrects a moving characteristic of the stage based on the calculated moving characteristic.

[Aspect 8]

A device manufacturing method comprises a step of exposing a substrate to a pattern by using an exposure apparatus according to any of Aspects 1 to 7.

[Aspect 9]

An exposure method applied to an exposure apparatus which projects a pattern on an original onto a substrate via a projection optical system while scanning the original and the substrate, the method comprises steps of projecting a slit shot pattern formed on the original onto plural areas of the substrate and an area partially overlapping four of the plural areas adjacent to each other, by having the original stand still and moving a stage which holds the substrate, measuring a positional deviation between partial patterns included in the shot patterns in the overlapping area, and projecting the pattern on the original onto the substrate while controlling movement of the stage based on a result of measurement in the measurement step.

[Aspect 10]

In Aspect 9, in the projection step, the shot pattern is projected so as to arrange respective centers of gravity of the plural areas at grid points.

[Aspect 11]

In Aspect 10, the grid points where the centers of gravity are arranged are different by line.

[Aspect 12]

In any one of Aspects 9 to 11, a plurality of the partial patterns are formed on each of two straight lines parallel with a lengthwise direction of the shot pattern.

[Aspect 13]

In any of Aspects 9 to 12, the method further comprises a step of calculating at least one of a positional error and a rotational error in each of the plural areas and the overlapping area as a moving characteristic of the stage based on a result of measurement in the measurement step, the control of movement of the stage in the exposure step is performed based on the moving characteristic calculated in the calculation step.

[Aspect 14]

In any of Aspects 9 to 13, the method further comprises a step of calculating at least one of a positional error and a rotational error in each of the plural areas and the overlapping area as a moving characteristic of the stage based on a result of measurement in the measurement step, the control of movement of the stage in the exposure step is performed by correcting a moving characteristic calculated in the calculation step.

More particularly, the measurement means (step) obtains measurement data of a relative positional difference dx, dy and a relative rotational angle difference dθ between adjacent shots from relative distances between adjacent shots from relative differences between the superposition marks in the shot overlap area. Then, the above measurement data is represented with only one equation constructed with positional differences dxi, dyi in an unknown shot, and arithmetic processing is performed by using mathematical calculation means.

By the above method, in a wafer where the adjustment of xy coordinate parallelism between the reticle projection image and the wafer stage as the above-described first adjustment item, and the xy axis rectangularity adjustment of the wafer stage as the second adjustment item, are performed, the adjustment of linearity of the xy axes of the wafer stage as the third adjustment item and the measurement of stability of the θ axis of the wafer stage as the fourth adjustment item can be performed.

Further, nonlinear positional errors in the stage xy plane are measured, and, appropriate stage grid error correction is performed in correspondence with the stage position based on the result of the measurement, thereby, an exposure apparatus with high matching accuracy can be realized.

As described above, according to the present invention, in a scanning exposure apparatus, a wafer stage moving characteristic can be measured with high accuracy.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Herein, below, preferred embodiments of the present invention will now be described in detail in accordance with the accompanying drawings.

First Embodiment

First, a first embodiment of the present invention, will be described.

Figure 1:
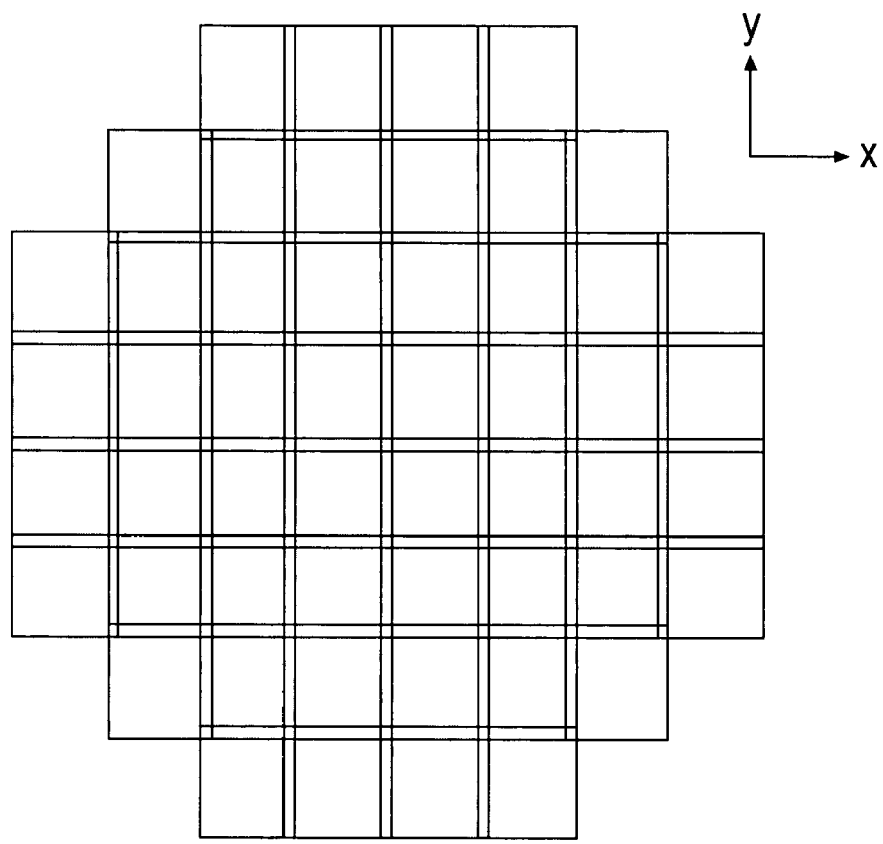
FIG. 1 is a schematic diagram showing an entire shot arrangement in a conventional art for measurement of linearity of the stage moving axis and attitude stability.
Figure 2:
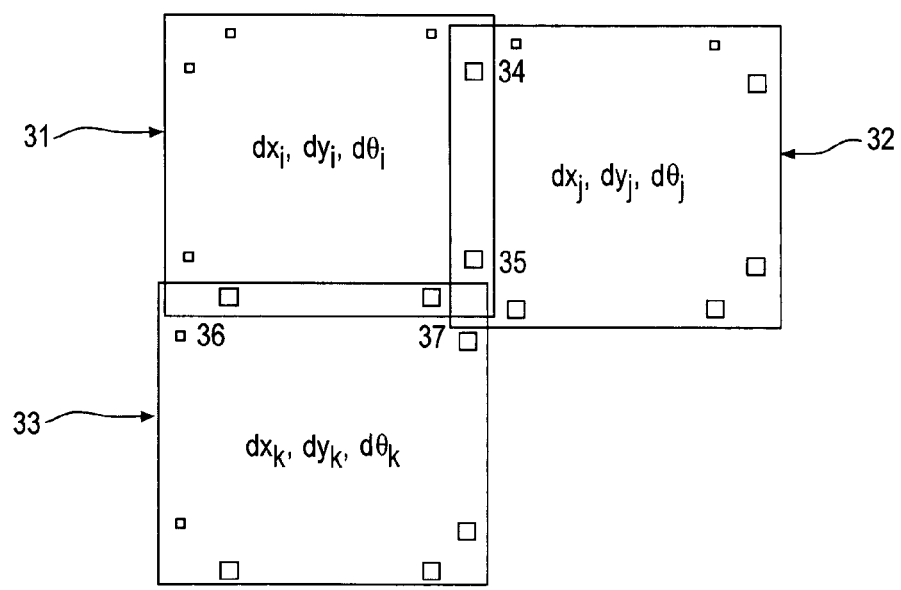
FIG. 2 is a partially enlarged view of the shot arrangement in the conventional art for measurement of linearity of the stage moving axis and attitude stability.
Figure 3A:
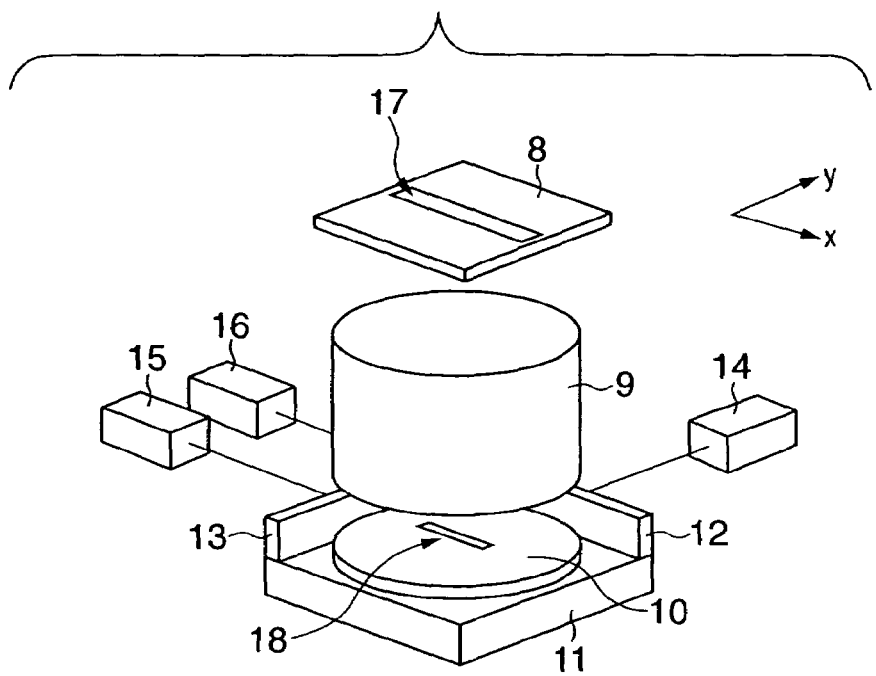
FIG. 3A is a perspective view of a scanning projection exposure apparatus according to embodiments of the present invention.
Figure 3B:
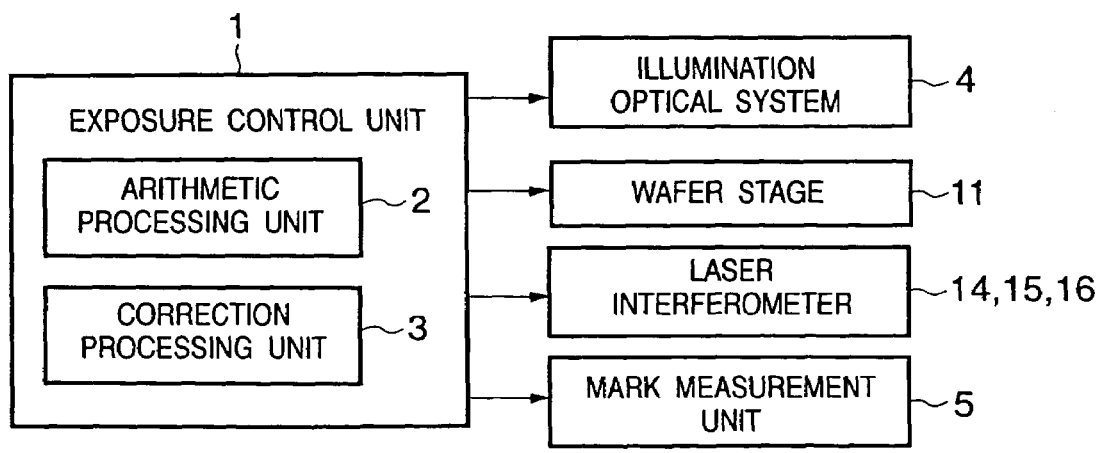
FIG. 3B is a block diagram showing the construction of the projection exposure apparatus.

As shown in FIGS. 3A and 3B, in a projection exposure apparatus, an illumination optical system 4 emits illumination light to a slit illumination area 17 on a reticle 8 on which a predetermined pattern is drawn. A part of the illuminated pattern on the reticle 8 is transferred via a projection lens 9 as a projection optical system to a wafer 10. The apparatus has a wafer stage 11 capable of moving in an xy plane orthogonal to an optical axis of the projection lens 9 while holding the wafer 10, laser interferometers 14 to 16 to measure the position and attitude of the wafer stage 11, reflecting mirrors 12 and 13 fixed to the wafer stage 11, and a mark measurement unit 5 to measure superposition marks included in a slit shot transferred on the wafer 10.

Note that, in addition to the wafer stage, a reticle stage movable in the xy plane orthogonal to the optical axis of the projection lens 9 while holding the reticle 8 may be provided as long as it scans the reticle 8 and the wafer 10 relative to each other.

Further, as shown in FIG. 3B, an exposure control unit 1 is provided to control stage movement and illumination and perform calculation of measurement values by the laser interferometers. The exposure control unit 1 is provided with an arithmetic processing unit 2 to calculate relative positional errors and attitude (rotational) errors of all the shots transferred on the wafer 10 at once from the result of measurement of the superposition marks by the mark measurement unit 5, and correction processing unit 3 as correction means for correcting the relative positional errors and attitude errors of all the shots calculated by the arithmetic processing unit 2 to appropriate values such that the exposure control unit 1 performs control reflecting the corrected values.

Figure 4:
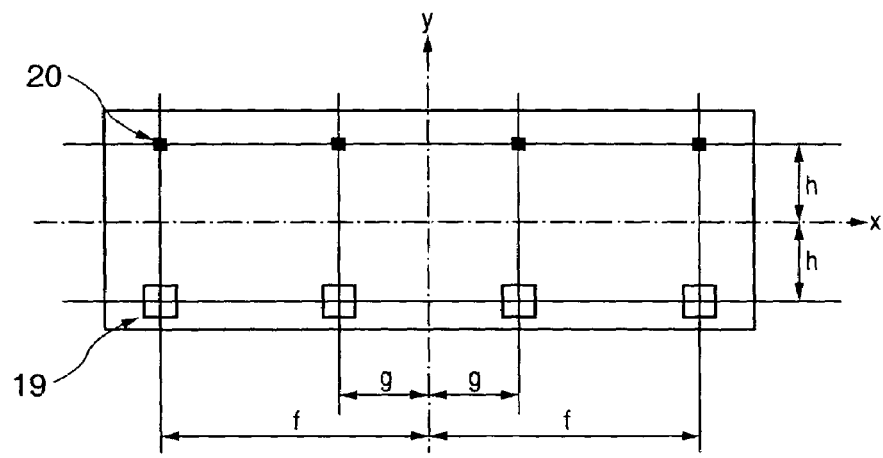
FIG. 4 is an explanatory view of a reticle pattern used in a first embodiment of the present invention.

In the exposure apparatus having the above construction, while the reticle 8 is stopped in a predetermined position, a long, slit-like pattern image corresponding to a drawing pattern (this drawing pattern is also referred to as "a slit shot pattern" or "a slit-like shot pattern") 17 on the reticle 8, as shown in FIG. 4, is transferred onto the wafer 10 plural times in a so-called brick pattern array (grid array). In the above pattern image, four hollow box marks 19 are formed at equal intervals along an x direction around one long side, and four solid box marks 20 are formed at equal intervals along an x direction around the other long side. The hollow box marks 19 and the solid box marks 20 are respectively symmetrically arranged in positions away from the center (gravity) position (intersection between the x axis and the y axis) of the pattern image by distances g and f (g<f) in the x direction, and symmetrically arranged in positions away from the center position by a distance h in the y direction.

In the center (gravity) position of at least one of first shots 22 to 25, its phase is shifted from a center (gravity) position of a second shot 21.

Figure 5:
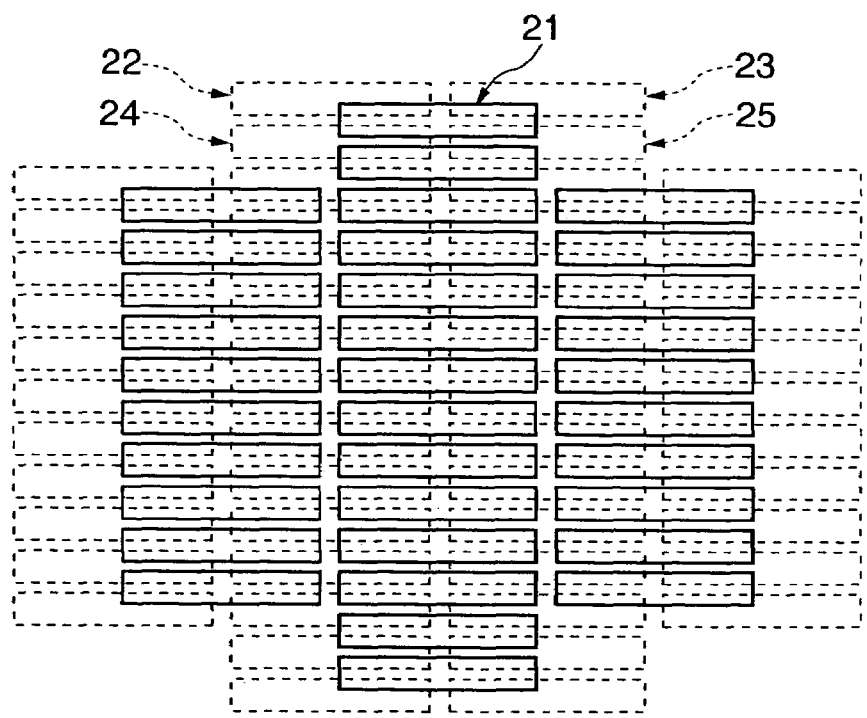
FIG. 5 is a schematic diagram showing an entire shot arrangement according to the first embodiment.
Figure 6:
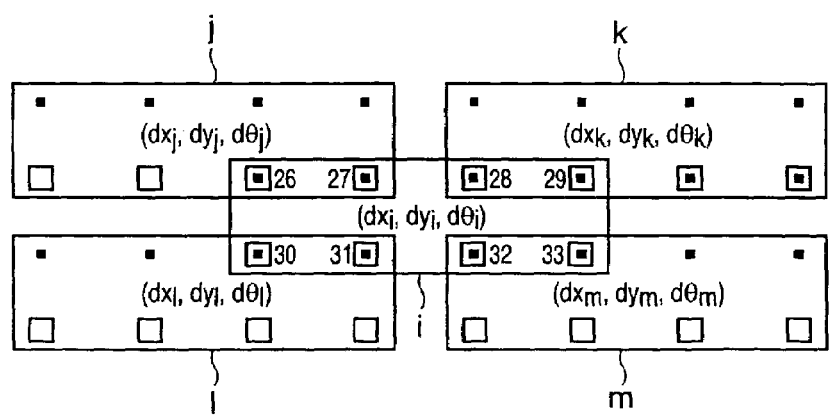
FIG. 6 is a partially enlarged view of the shot arrangement according to the first embodiment.

The above pattern image is transferred onto the wafer 10 in a shot array as shown in FIG. 5. That is, the first shots 22 to 25 are transferred onto the wafer 10, and the second shot 21 is transferred onto the wafer 10 such that the second shot partially overlaps the four first shots 22 to 25 with their long sides being adjacent to each other. At this time, as shown in FIG. 6, in an area where the first shots 22 to 25 and the second shot 21 overlap, the hollow marks 19 included in the first shots 22 and 23 and the solid box marks 20 included in the second shot 21 overlap each other, and the solid box marks 20 included in the first shots 24 and 25 and the hollow box marks 19 included in the second shot 21 overlap each other, thereby superposition marks 26 to 33 are formed. That is, the superposition marks 26 to 33 are arrayed on two straight lines parallel in the x direction.

The mark measurement unit 5 measures these superposition marks 26 to 33 regarding all the shots, and, as described later, the arithmetic processing unit 2 calculates the relative positional errors and attitude errors of all the shots transferred on the wafer at once.

Among the superposition marks 26 to 33 in FIG. 6, regarding the superposition marks 26 and 27 overlapping between adjacent shots (i) and (j), the centers of gravity (exUL1, eyUL1) and (exUL2, eyUL2) of the solid box marks are measured in the x-axial direction and the y-axial direction with reference to the centers of gravity of the hollow box marks. Similarly, the measurement values in the x-axial direction, measurement values in the x-axial direction and the y-axial direction, measured from the superposition marks 28 to 33 among the shots (k), (l) and (m) adjacent to the shot (i), are defined as (exUR1, eyUR1), (exUR2, eyUR2), (exDL1, eyDL1), (exDL2, eyDL2), (exDR1, eyDR1) and (exDR2, eyDR2).

At this time, the errors of positions and attitudes (rotational angles about the z axis) of the shots (i), (j), (k), (l) and (m) are defined as (dxi, dyi, dθi), (dxj, dyj, dθj), (dxk, dyk, dθk), (dxl, dyl, dθl) and (dxm, dym, θ dθm).

Further, errors unique to the respective superposition marks caused by distortion of a reticle projection image and/or stage measurement scale error are defined as DXUL1, DXUL2, DYUL1, DYUL2, DXUR1, DXUR2, DYUR1, DYUR2, DXDL1, DXDL2, DYDL1, DYDL2, DXDR1, DXDR2, and DYDR1, DYDR2.

Further, in a case in which irregular errors such as round errors caused upon measurement of the respective superposition marks are defined as exLU1(i, j), exLU2(i, j), eyLU1(i, j), eyLU2(i, j), exUR1(i, k), exUR2(i, k), eyUR1(i, k), eyUR2(i, k), exDL1(i, l), exDL2(i, l), eyDL1(i, l), eyDL2(i, l), exDR1(i, m), exDR2(i, m), and eyDR1(i, m), eyDR2(i, m), the following expressions (1) to (16) hold.

$$ex_{UL1(i,j)} = dx_j - dx_i + hd\theta_i + \Delta x_{UL1} + \epsilon x_{UL1(i,j)} \quad (1)$$

$$ex_{UL2(i,j)} = dx_j - dx_i + hd\theta_i + \Delta x_{UL2} + \epsilon x_{UL2(i,j)} \quad (2)$$

$$ey_{UL1(i,j)} = dy_j - dy_i + gd\theta_j + fd\theta_i + \Delta y_{UL1} + \epsilon y_{UL1(i,j)} \quad (3)$$

$$ey_{UL2(i,j)} = dy_j - dy_i + fd\theta_j + gd\theta_i + \Delta y_{ULs} + \epsilon y_{UL2(i,j)} \quad (4)$$

$$ex_{UR1(i,k)} = dx_k - dx_i + hd\theta_k + hd\theta_i + \Delta x_{UR1} + \epsilon x_{UR1(i,k)} \quad (5)$$

$$ex_{UR2(i,k)} = dx_k - dx_i + hd\theta_k + hd\theta_i + \Delta x_{UR2} + \epsilon x_{UR2(i,k)} \quad (6)$$

$$ey_{UR1(i,k)} = dy_k - dy_i - gd\theta_k - fd\theta_i + \Delta y_{UR1} + \epsilon y_{UR1(i,k)} \quad (7)$$

$$ey_{UR2(i,k)} = dy_k - dy_i - fd\theta_k - gd\theta_i + \Delta y_{UR2} + \epsilon y_{UR2(i,k)} \quad (8)$$

$$-ex_{DL1(i,l)} = dx_l - dx_i - hd\theta_l - hd\theta_i + \Delta x_{DL1} + \epsilon x_{DL1(i,l)} \quad (9)$$

$$-ex_{DL2(i,l)} = dx_l - dx_i - hd\theta_l - hd\theta_i + \Delta x_{DL2} + \epsilon x_{DL2(i,l)} \quad (10)$$

$$-ey_{DL1(i,l)} = dy_l - dy_i + gd\theta_l + fd\theta_i + \Delta y_{DL1} + \epsilon y_{DL1(i,l)} \quad (11)$$

$$-ey_{DL2(i,l)} = dy_l - dy_i + fd\theta_l + gd\theta_i + \Delta y_{DL2} + \epsilon y_{DL2(i,l)} \quad (12)$$

$$-ex_{DR1(i,m)} = dx_m - dx_i - hd\theta_m - hd\theta_i + \Delta x_{DR1} + \epsilon x_{DR1(i,m)} \quad (13)$$

$$-ex_{DR2(i,m)} = dx_m - dx_i - hd\theta_m - hd\theta_i + \Delta x_{DR2} + \epsilon x_{DR2(i,m)} \quad (14)$$

$$-ey_{DR1(i,m)} = dy_m - dy_i - gd\theta_m - fd\theta_i + \Delta y_{DR1} + \epsilon y_{DR1(i,m)} \quad (15)$$

$$-ey_{DR2(i,k)} = dy_m - dy_i - fd\theta_m - gd\theta_i + \Delta y_{DR2} + \epsilon y_{DR2(i,m)} \quad (16)$$

Note that errors caused by the distortion of reticle projection image and/or stage measurement scale error and the irregular errors, such as rounding errors, caused upon measurement of superposition marks are previously measured by measurement means such as an absolute meter, and these errors are obtained by calculation of stage rectangularity and/or scale errors.

Further, it may be arranged such that considering that the above errors cannot be distinguished from the stage rectangularity and/or scale errors, the errors are not obtained by calculation of stage rectangularity and/or scale errors.

In the above expressions (1) to (16), assuming that, in odd-numbered (or even-numbered) shots, the number of shots with all the superposition marks is Na, while in even-numbered (or odd-numbered) shots, the number of shots related to formation of superposition marks is Nb, the total number of shots is Na+Nb. As the x direction, the y direction and the θ direction are unknown in each shot, the number of unknowns, including the unique error to each superposition mark, is 3(Na+Nb)+8.

On the other hand, the number of equations is 16Na, however, unless the mean value of the positional error (dxi, dyi) and attitude error (dθi), the slopes of array in the x and y directions, and the array scale error are set to be constant values in each even-numbered shots and odd-numbered shots, the equations are indefinite simultaneous equations and a solution cannot be obtained.

Accordingly, the following equations (17) to (23) are added.

$$\sum_{i=1}^{Na+Nb} dx_i = 0 \quad (17)$$

$$\sum_{i=1}^{Na+Nb} dy_i = 0 \quad (18)$$

$$\sum_{i=1}^{Na+Nb} d\theta_i = 0 \quad (19)$$

$$\sum_{i=1}^{Na+Nb} X_i dx_i = 0 \quad (20)$$

$$\sum_{i=1}^{Na+Nb} Y_i dx_i = 0 \quad (21)$$

$$\sum_{i=1}^{Na+Nb} X_i dy_i = 0 \quad (22)$$

$$\sum_{i=1}^{Na+Nb} Y_i dy_i = 0 \quad (23)$$

Note that "Xi" and "Yi" are vector elements, indicating the central wafer coordinate position in each shot, adjusted such that the total sum of all the shots becomes zero.

From the above equations, 16Na+7 simultaneous equations are constructed.

As described above, the number of unknowns in the simultaneous equations is 3(Na+Nb)+8.

Accordingly, the number of equations and the number of unknowns must satisfy the relation show in the following equation (24).

$$16Na+7 \geq 3(Na+Nb)+8 \quad (24)$$

By expressing the above-constructed simultaneous equations in only one simultaneous equation, and by performing arithmetic processing using mathematical computation means by the least square method, the arithmetic processing unit 2 performs arithmetic processing of the relative positional errors and attitude errors of all the shots transferred onto the wafer 10 at once, and the correction processing unit 3 corrects the relative positional errors and attitude errors of all the shots calculated by the arithmetic processing unit 2 to appropriate values such that the exposure control unit 1 performs control reflecting the result of correction, e.g., moving control of the wafer stage 11 (positional correction).

According to the above embodiment, as a wafer stage moving characteristic, the linearity of the x and y axes and the stability of the θ axis can be measured with high accuracy.

Further, as the nonlinear positional errors of the wafer stage in the xy plane are measured and the stage grid errors are appropriately corrected in correspondence with the stage position based on the result of measurement, exposure with high matching accuracy can be realized, and a semiconductor device can be manufactured more accurately by using the above method.

Second Embodiment

Figure 7:
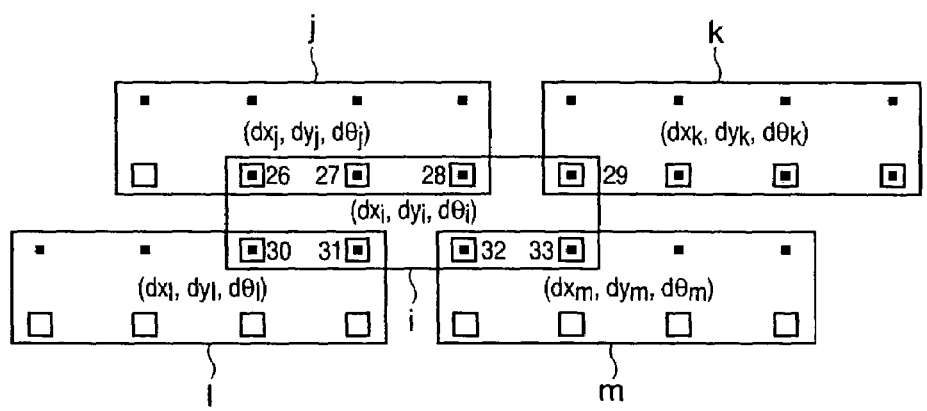
FIG. 7 is a partially enlarged view of the shot arrangement according to a second embodiment of the present invention.
Figure 8:
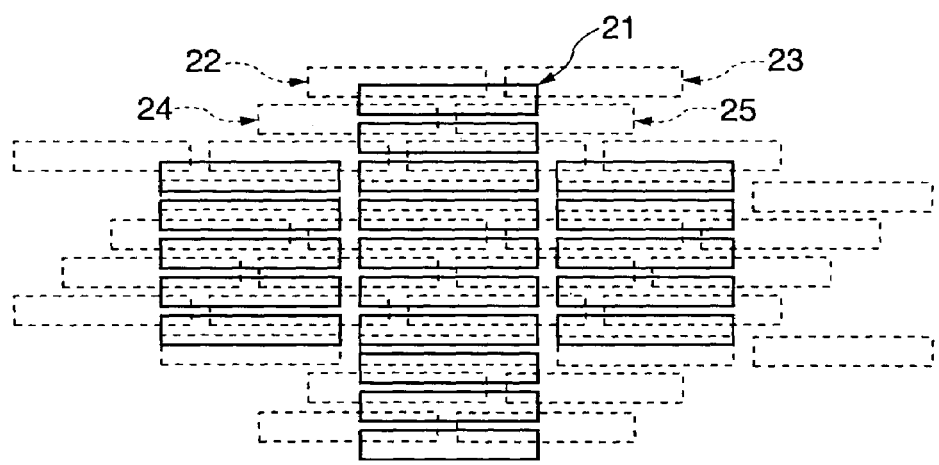
FIG. 8 is a schematic diagram showing an entire shot arrangement according to the second embodiment.

As a second embodiment of the present invention, in an odd-numbered or even-numbered shot, upon movement in an array direction (y direction), the shot central position is shifted in a direction along the long side (x direction) by one pitch of superposition marks, as shown in FIGS. 7 and 8.

This embodiment is advantageous in a case in which the stage grid change cannot be precisely measured since the shot shape is long in the x direction and the shot interval is wide.

Third Embodiment

Figure 9:
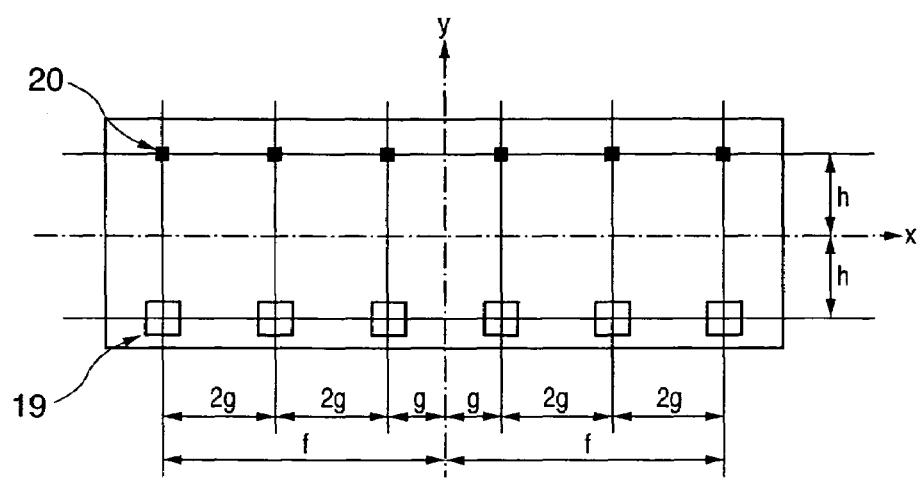
FIG. 9 is an explanatory view of a reticle pattern used in the second embodiment.

Further, as a third embodiment of the present invention, the number of marks within one shot is increased, as shown in FIG. 9.

This reduces the influence of the errors upon measurement of the respective superposition marks, (exUL1(i, j), exUL2(i, j), eyUL1(i, j), eyUL2(i, j), exUR1(i, j), exUR2(i, j), eyUR1(i, j), eyUR2(i, j), exDL1(i, j), exDL2(i, j), eyDL1 (i, j), eyDL2(i, j), exDR1(i, j), exDR2(i, j), and eyDR1(i, j), eyDR2(i, j), and improves the estimated accuracy.

Then, simultaneous equations are constructed by using the obtained measurement data of the superposition marks as in the case of the first embodiment, and, thus, the positional and attitude errors (dxi, dyi, dθi) in each shot can be obtained.

As the types of shot central position coordinates in the shot long side direction are increased, more accurate stage grid measurement and correction can be expected.

Fourth Embodiment

Figure 10:
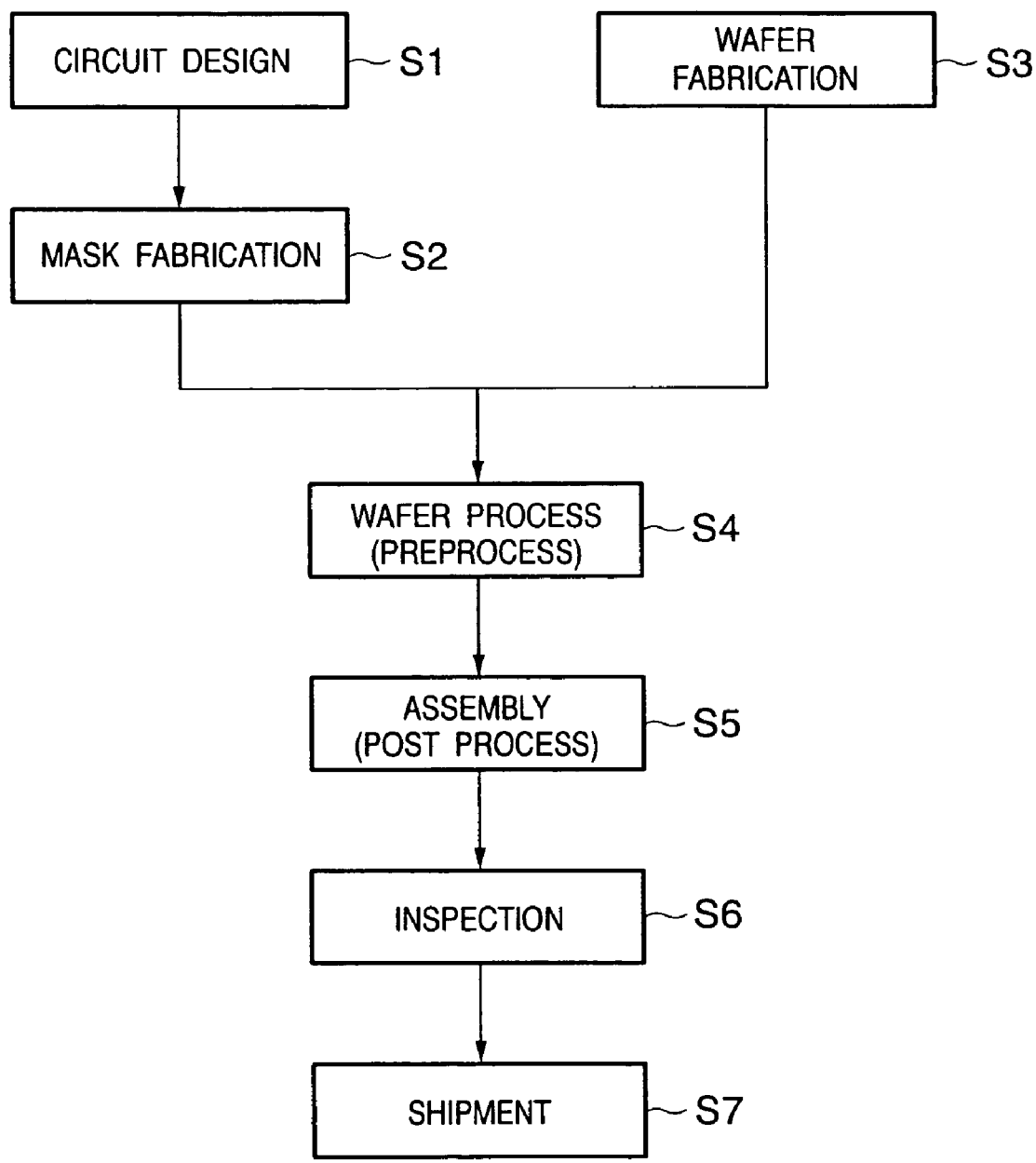
FIG. 10 is a flowchart showing an entire semiconductor device manufacturing process.

Next, a semiconductor device manufacturing process utilizing the exposure apparatus will be described. FIG. 10 is a flowchart showing an entire semiconductor device manufacturing process. At step S1 (circuit designing), a semiconductor device circuit pattern is designed. At step 2 (mask fabrication), a mask is fabricated based on the designed circuit pattern.

On the other hand, at step 3 (wafer fabrication), a wafer is fabricated by using a material such as silicon. At step 4 (wafer process), called a preprocess, an actual circuit is formed by the above exposure apparatus on the wafer by a lithography technique using the above mask and wafer. At the next step, step 5 (assembly), called a post-process, a semiconductor chip is fabricated by using the wafer formed at step 4. Step 5 includes an assembly process (dicing and bonding), a packaging process (chip encapsulation), and the like. At step 6 (inspection), inspections such as a device operation check, a durability test, and the like, are performed on the semiconductor device formed at step 5. The semiconductor device is completed through these processes, and is shipped at step 7.

The wafer process at step 4 has the following steps: an oxidation step of oxidizing the surface of the wafer, a CVD step of forming an insulating film on the surface of the wafer, an electrode formation step of forming electrodes by vapor deposition on the wafer, an ion implantation step of injecting ions in the wafer, a resist processing step of coating the wafer with a photo resist, an exposure step of transferring the circuit pattern onto the resist-processed wafer by the above-described exposure apparatus, a development step of developing the wafer exposed at the exposure step, an etching step of removing other portions than the resist developed at the development step, and a resist stripping step of removing the resist, which is unnecessary, after the completion of etching. These steps are repeated, to form multiple layers of circuit patterns on the wafer.

OTHER EMBODIMENT

The object of the present invention can also be achieved by providing software program code for realizing an exposure method using the above-described error calculation and error correction to a system or an apparatus directly or from a remote place, and reading an executing the program code with a computer of the system or apparatus. In this case, the program may be software other than a program having a function equivalent to that of the program.

Accordingly, the program and/or software itself is an aspect of the present invention.

In such a case, the program having any form, such as object code, an interpreter-executable program and script data supplied to an operating system (OS), can be employed as long as it has a program function.

Further, the storage medium, such as a flexible disk, a hard disk, an optical disk, a magneto-optical disk, an MO, a CD-ROM, a CD-R, a CD-RW, a magnetic tape, a non-volatile type memory card, a ROM, and a DVD (DVD-ROM and DVD-R), can be used for providing the program.

As a method of supplying the program, a data file of a computer program itself or a compressed file having an automatic installation function, which can be a computer program forming the present invention on a client computer, may be downloaded from a home page on the Internet to a connected client computer by using a browser on the client computer. Further, the program data file may be divided into plural segment files and may be downloaded from different home pages. That is, a World Wide Web (WWW) server apparatus for downloading the program data file to the client computer is an aspect of the present invention.

Further, the program of the present invention may be encrypted and stored on a storage medium, such as a CD-ROM delivered to users, such that a user who satisfied a predetermined condition is allowed to download key information to decryption from a homepage via, e.g., the Internet., then, the program is decrypted with the key information and installed into a computer, thereby the present invention is realized.

Furthermore, besides the aforesaid functions according to the above embodiments are realized by executing the program code, which is read by a computer, the present invention includes a case wherein an OS (operating system), or the like, working on the computer performs a part of or entire actual processing in accordance with designations of the program code and realizes functions according to the above embodiments.

Furthermore, the present invention also includes a case wherein, after the program code read from the storage medium is written in a function expansion card, which is inserted into the computer or in a memory provided in a function expansion unit, which is connected to the computer, CPU, or the like, contained in the function expansion card or unit performs a part of or an entire process in accordance with designations of the program code and realizes functions of the above embodiments.

The present invention is not limited to the above embodiments and various changes and modifications can be made within the spirit and scope of the present invention. Therefore, to apprise the public of the scope of the present invention, the following claims are made.

What is claimed is:

1. An exposure apparatus for exposing a substrate to light via a pattern of an original while the original and the substrate are scanned, said apparatus comprising:
 a stage configured to hold the substrate and to move;
 a projection optical system configured to project the pattern of the original onto the substrate;
 a measurement unit configured to measure a positional deviation between superposition marks formed on the substrate; and
 a controller configured to control operation of projection of a slit shot pattern of an original onto plural areas of a substrate, with each area partially overlapping four of the plural areas adjacent to each other, the projection being performed by keeping the original stand still and moving said stage, to cause said measurement unit to perform measurement of a positional deviation between superposition marks in each of the overlapping areas formed through the projection, and to control movement of said stage based on the measurement.

2. An apparatus according to claim 1, wherein said controller is configured to control the operation of projection so as to arrange respective centers of gravity of the plural areas at grid points.

3. An apparatus according to claim 2, wherein positions of the grid points in a first row are different from positions of the grid points in a second row adjacent to the first row.

4. An apparatus according to claim 1, wherein said controller is configured to control the operation of projection so that a plurality of the superposition marks are formed on each of two straight lines parallel with a lengthwise direction of the slit shot pattern with respect to each area.

5. An apparatus according to claim 1, wherein said controller is configured to calculate at least one of a positional error and a rotational error in each area and each of the plural areas as a moving characteristic of said stage.

6. An apparatus according to claim 5, wherein said controller is configured to control movement of said stage based on the calculated moving characteristic.

7. An apparatus according to claim 5, wherein said controller is configured to correct a moving characteristic of said stage based on the calculated moving characteristic.

8. A method of manufacturing a device, said method comprising steps of:
 exposing a substrate to light via a pattern of an original using an exposure apparatus as defined in claim 1;
 developing the exposed substrate; and
 processing the developed substrate to manufacture the device.

9. An exposure method applied to an exposure apparatus for performing exposure of a substrate to light via a pattern of an original while the original and the substrate are scanned, said method comprising steps of:
 performing projection of a slit shot pattern of an original onto plural areas of a substrate, with each area partially overlapping four of the plural areas adjacent to each other, the projection being performed by keeping the original stand still and moving a stage which holds the substrate;
 performing measurement of a positional deviation between superposition marks in each of the overlapping areas formed through the projection; and
 performing the exposure by controlling movement of the stage based on the measurement.

10. A method according to claim 9, wherein said step of performing projection projects the slit shot patterns so as to arrange respective centers of gravity of the plural areas at grid points.

11. A method according to claim 10, wherein positions of the grid points in a first row are different from positions of the grid points in a second row adjacent to the first row.

12. A method according to claim 9, wherein said step of performing projection projects the slit shot patterns so that a plurality of the superposition marks are formed on each of two straight lines parallel with a lengthwise direction of the slit shot pattern with respect to each area.

13. A method according to claim 9, further comprising a step of calculating at least one of a positional error and a rotational error in each area and each of the plural areas as a moving characteristic of the stage based on the measurement, wherein said step of performing the exposure controls the movement of the stage based on the calculated moving characteristic.

14. A method according to claim 9, further comprising a step of calculating at least one of a positional error and a rotational error in each area and each of the plural areas as a moving characteristic of the stage based on the measurement, wherein said step of performing the exposure corrects a moving characteristic of the stage based on the calculated moving characteristic.

* * * * *

UNITED STATES PATENT AND TRADEMARK OFFICE
CERTIFICATE OF CORRECTION

PATENT NO. : 7,084,957 B2
APPLICATION NO. : 10/912097
DATED : August 1, 2006
INVENTOR(S) : Youzou Fukagawa It is certified that error appears in the above-identified patent and that said Letters Patent is hereby corrected as shown below:

ON THE TITLE PAGE:
    In item "(56) References Cited," under "FOREIGN PATENT DOCUMENTS," the fourth-listed document "JP    2003-292921    10/2000" should read -- JP  2003-292921    8/2003 --.
    In item "(57) ABSTRACT," line 12, "stand still" should read -- at a standstill --.

COLUMN 1:
    Line 64, "in th above" should read -- in the above --.
    Line 67, "(so-called a" should read -- (a so-called --.

COLUMN 3:
    Line 56, "thereby," should read -- whereby --.

COLUMN 5:
    Line 45, "thereby" should read -- whereby --.
    Line 60, "x-axial direction, measurement values in the" should be deleted.
    Line 64, "exUR2," should read -- (exUR2, --.

COLUMN 6:
    Line 2, "dym, $\theta d\theta m$)." should read -- dym, $d\theta m$). --.
    Line 48, "an·absolute" should read -- an absolute --.

COLUMN 7:
    Line 2, "in each" should read -- in each of the --.
    Line 40, "show" should read -- shown --.

COLUMN 8:
    Line 19, "(exUL1(i, j)," should read -- exUL1(i, j), --.
    Line 39, "step 2" should read -- step S2 --.
    Line 42, "step 3" should read -- step S3 --.
    Line 43, "step 4" should read -- step S4 --.
    Line 47, "step 5" should read -- step S5 --.
    Line 49, "step 4. Step 5" should read -- step S4. Step S5 --.
    Line 51, "step 6" should read --step S6 --.
    Line 53, "step 5." should read -- step S5. --.
    Line 55, "step 7." should read -- step S7. --.
    Line 56, "step 4" should read -- step S4 --.

UNITED STATES PATENT AND TRADEMARK OFFICE
CERTIFICATE OF CORRECTION

PATENT NO. : 7,084,957 B2
APPLICATION NO. : 10/912097
DATED : August 1, 2006
INVENTOR(S) : Youzou Fukagawa It is certified that error appears in the above-identified patent and that said Letters Patent is hereby corrected as shown below:

COLUMN 9:
    Line 11, "an executing" should read -- and executing --.
    Line 42, "Internet.," should read -- Internet, --.
    Line 43, "thereby" should read -- whereby --.
    Line 46, "are realized" should read -- being realized --.

COLUMN 10:
    Line 15, "stand still" should read -- at a standstill --.
    Line 60, "stand still" should read -- at a standstill --.

Signed and Sealed this

First Day of May, 2007

JON W. DUDAS
*Director of the United States Patent and Trademark Office*